(12) United States Patent
Cheng et al.

(10) Patent No.: US 8,994,006 B2
(45) Date of Patent: Mar. 31, 2015

(54) NON-VOLATILE MEMORY DEVICE EMPLOYING SEMICONDUCTOR NANOPARTICLES

(71) Applicant: International Business Machines Corporation, Armonk, NY (US)

(72) Inventors: Kangguo Cheng, Guilderland, NY (US); Robert H. Dennard, Cronton-on-Hudson, NY (US); Hemanth Jagannathan, Guilderland, NY (US); Ali Khakifirooz, Slingerlands, NY (US); Tak H. Ning, Yorktown Heights, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/633,347

(22) Filed: Oct. 2, 2012

(65) Prior Publication Data

US 2014/0091281 A1 Apr. 3, 2014

(51) Int. Cl.
*H01L 29/06* (2006.01)
*H01L 29/08* (2006.01)
*H01L 27/115* (2006.01)

(52) U.S. Cl.
CPC ........ *H01L 27/115* (2013.01); *H01L 27/11563* (2013.01)
USPC ............. 257/39; 257/321; 257/324; 257/326; 257/E29.309

(58) Field of Classification Search
CPC .............. B82Y 10/00; H01L 21/28273; H01L 21/28282; H01L 27/115; H01L 27/11517; H01L 27/11524; H01L 27/11563; H01L 27/11568; H01L 29/42332; H01L 29/42348; H01L 29/66825; H01L 29/66833; H01L 29/788; H01L 29/7881; H01L 29/7883; H01L 29/792; H01L 29/7923
USPC .................... 257/39, 321, 324, 326, E21.209, 257/E21.21, E21.679, E27.103, E29.309
See application file for complete search history.

(56) References Cited

U.S. PATENT DOCUMENTS 6,700,155 B1 3/2004 King et al.
6,984,842 B1 1/2006 Nayfeh et al.
(Continued)

OTHER PUBLICATIONS

Rao et al., Silicon nanocrystal based memory devices for NVM and DRAM applications, Solid-State Electronics, vol. 48, Issue 9, Sep. 2004, pp. 1463-1473, ISSN 0038-1101.*
(Continued)

*Primary Examiner* — Fernando L Toledo
*Assistant Examiner* — Christine C Lau
(74) *Attorney, Agent, or Firm* — Scully, Scott, Murphy & Presser, P.C.; Daniel P. Morris

(57) ABSTRACT

Semiconductor nanoparticles are deposited on a top surface of a first insulator layer of a substrate. A second insulator layer is deposited over the semiconductor nanoparticles and the first insulator layer. A semiconductor layer is then bonded to the second insulator layer to provide a semiconductor-on-insulator substrate, which includes a buried insulator layer including the first and second insulator layers and embedded semiconductor nanoparticles therein. Back gate electrodes are formed underneath the buried insulator layer, and shallow trench isolation structures are formed to isolate the back gate electrodes. Field effect transistors are formed in a memory device region and a logic device region employing same processing steps. The embedded nanoparticles can be employed as a charge storage element of non-volatile memory devices, in which charge carriers tunnel through the second insulator layer into or out of the semiconductor nanoparticles during writing and erasing.

23 Claims, 9 Drawing Sheets

(56) References Cited

U.S. PATENT DOCUMENTS

| | | | |
|---|---|---|---|
| 7,012,297 | B2 | 3/2006 | Bhattacharyya |
| 7,517,747 | B2 | 4/2009 | Muralidhar et al. |
| 7,525,147 | B2 | 4/2009 | Chen et al. |
| 7,550,802 | B2 | 6/2009 | Koyanagi et al. |
| 2007/0014151 | A1* | 1/2007 | Zhang et al. ............. 365/185.01 |
| 2008/0144365 | A1* | 6/2008 | Yamaoka et al. ............. 365/181 |
| 2008/0293207 | A1 | 11/2008 | Koutny, Jr. et al. |
| 2008/0296658 | A1 | 12/2008 | Maurelli |
| 2009/0057745 | A1* | 3/2009 | Yin et al. ..................... 257/315 |
| 2011/0233654 | A1* | 9/2011 | Chih et al. ................... 257/325 |
| 2012/0217561 | A1* | 8/2012 | Khakifirooz et al. ......... 257/314 |

OTHER PUBLICATIONS

Tiwari, S. et al., "Volatile and Non-Volatile Memories in Silicon with Nano-Crystal Storage" International Electron Devices Meeting, (Dec. 10-13, 1995) pp. 521-524.

Hiramoto, T. et al., "Emerging Nanoscale Silicon Devices Taking Advantage of Nanostructure Physics" IBM Journal of Research and Development (Jul./Sep. 2006) pp. 411-418, vol. 50, Issues 4-5.

Rao, R. A. et al., "Silicon Nanocrystal Nonvolatile Memory" Nanotechnology for Electronic Materials and Devices Nanostructure Science and Technology (2007) pp. 171-197.

* cited by examiner

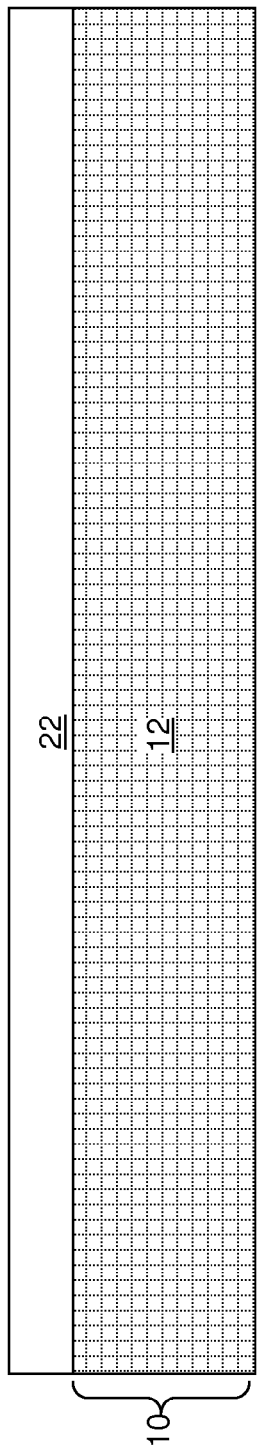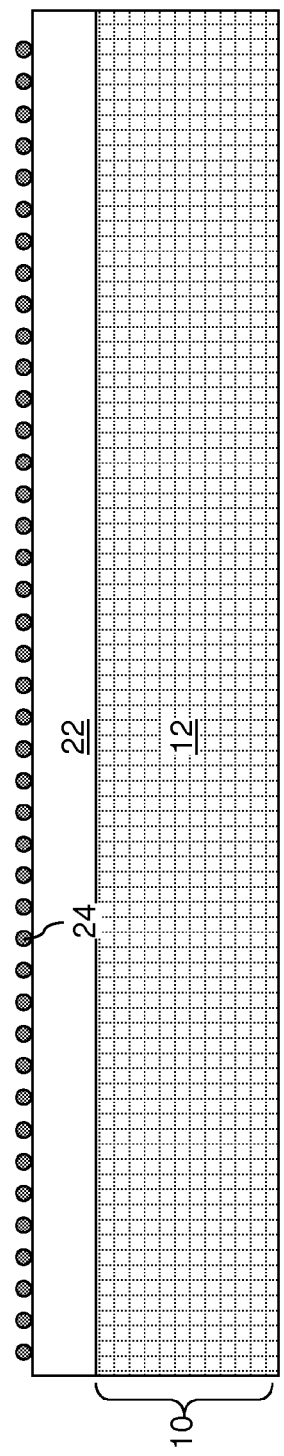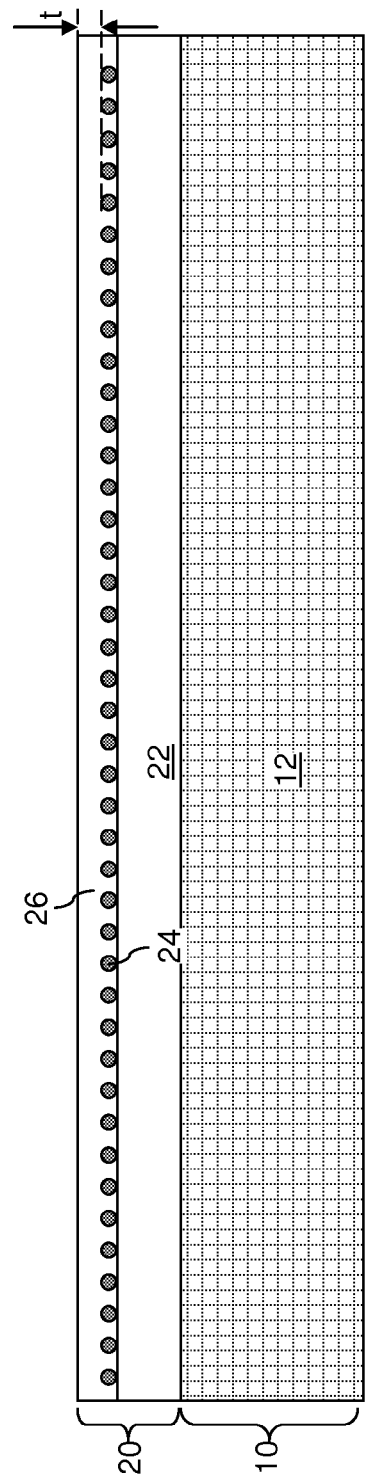

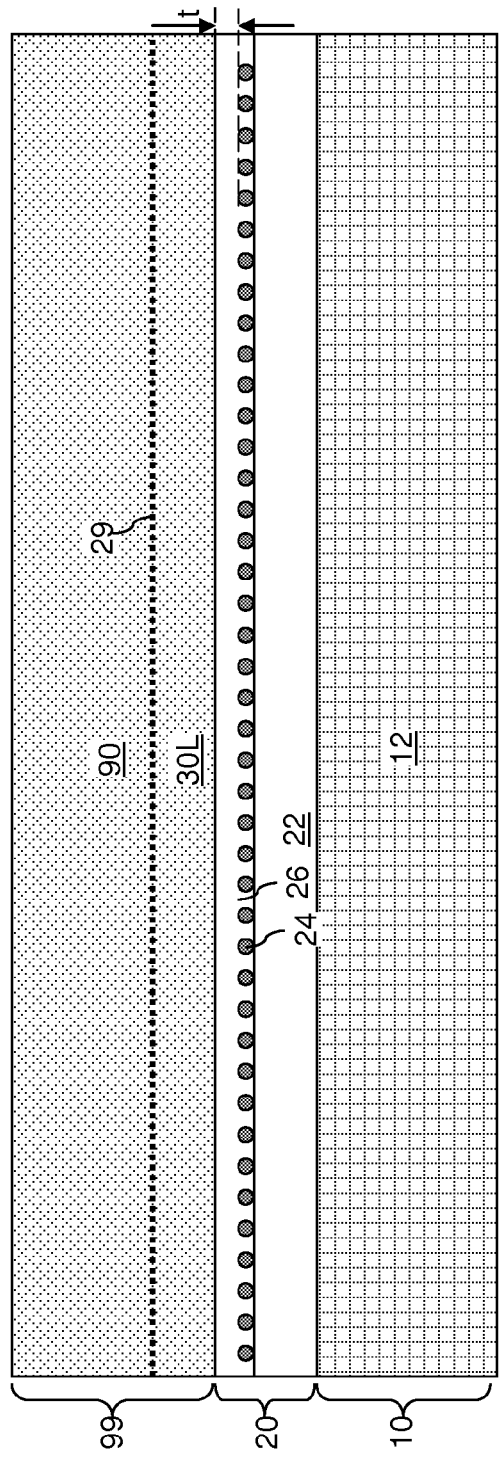
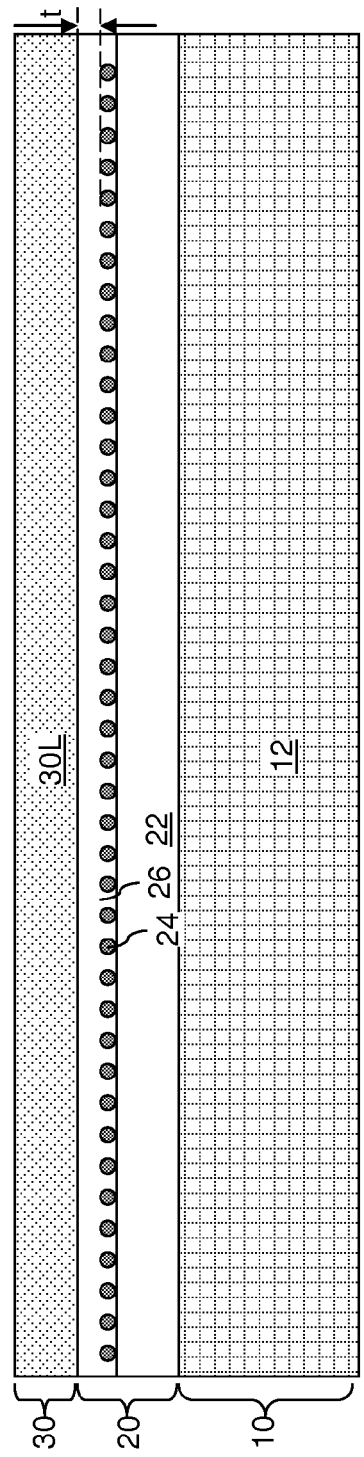

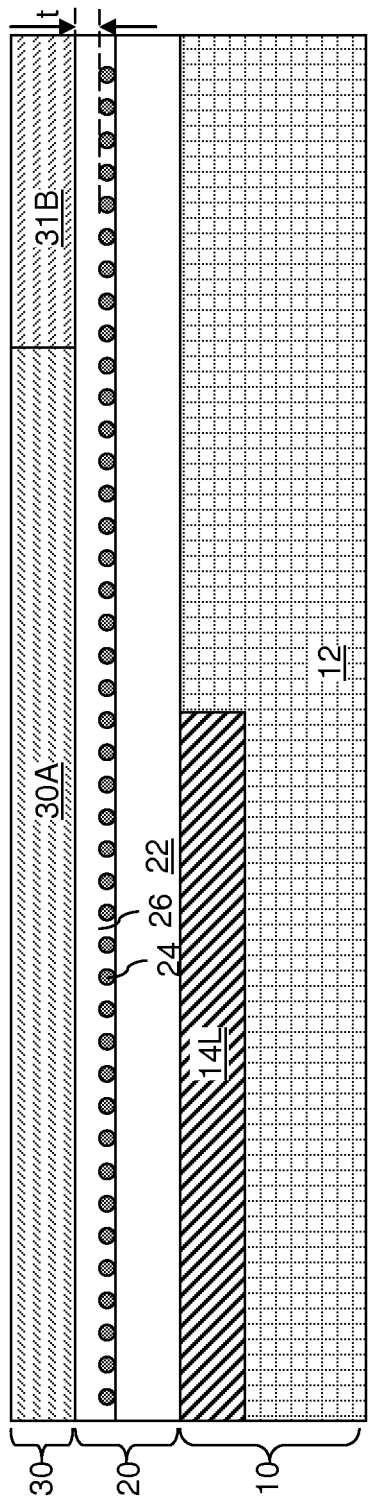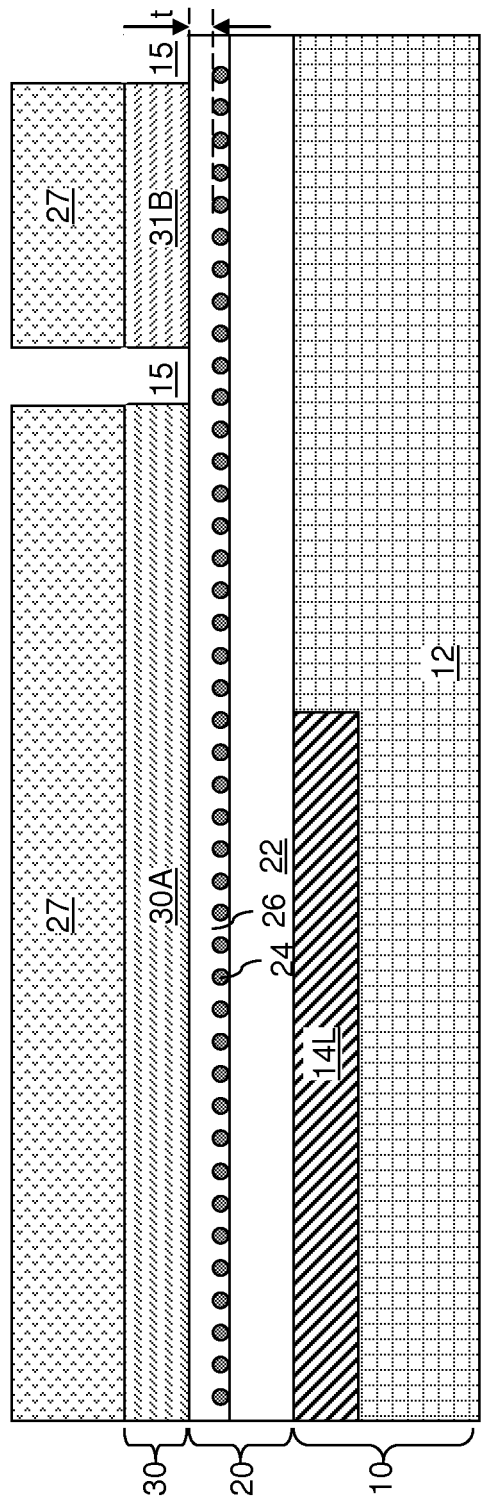

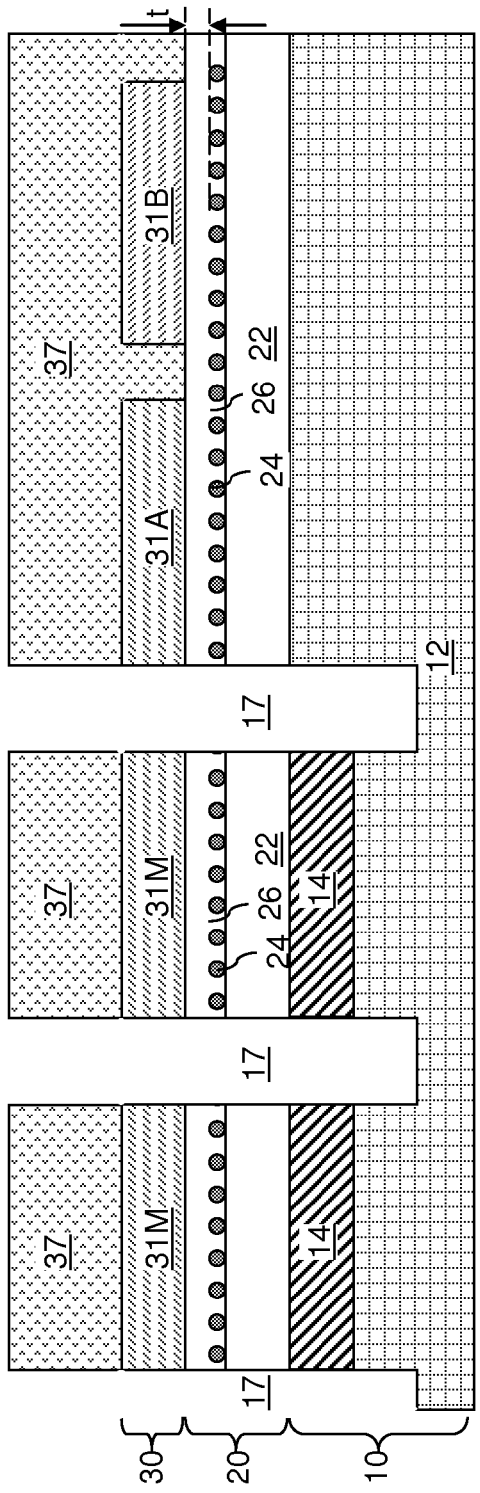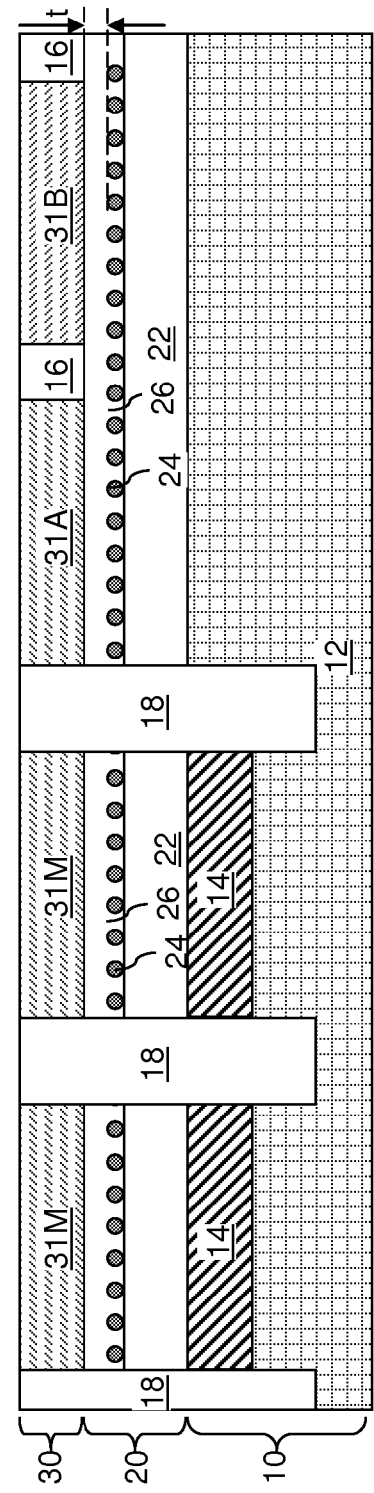

US 8,994,006 B2

NON-VOLATILE MEMORY DEVICE EMPLOYING SEMICONDUCTOR NANOPARTICLES

BACKGROUND

The present disclosure generally relates to semiconductor devices, and more particularly to non-volatile memory devices employing semiconductor nanoparticles, semiconductor substrates including embedded semiconductor nanoparticles within a buried insulator layer, and methods of manufacturing the same.

Non-volatile memory devices require an information storage element for storing information, for example, in states having, or not having, stored electrical charges. For example, a flash memory device requires a floating gate and a tunneling dielectric. Such information storage elements are typically formed above the top surface of a semiconductor substrate. For example, the floating gate and the tunneling dielectric of a flash memory device are formed above the top surface of a semiconductor substrate. A control electrode and a control gate are formed above the stack of the tunneling dielectric and the floating gate in the flash memory device.

The presence of the information storage element as an additional component for a non-volatile memory device causes the integration of non-volatile memory devices with logic devices to be difficult. For example, a gate stack including a tunneling dielectric, a floating gate, a control gate dielectric, and a control gate electrode for a non-volatile memory device has a different gate height than a gate stack including a gate dielectric and a gate electrode for a logic device. Thus, the requirement for formation of the information storage element in non-volatile memory devices not only causes use of additional processing steps to form the information storage element, but the presence of the information storage element also interferes with subsequent processing steps for formation of logic devices, for example, through increased height variations of structures on a semiconductor substrate.

SUMMARY

Semiconductor nanoparticles are deposited on a top surface of a first insulator layer of a substrate. A second insulator layer is deposited over the semiconductor nanoparticles and the first insulator layer. A semiconductor layer is then bonded to the second insulator layer to provide a semiconductor-on-insulator substrate, which includes a buried insulator layer including the first and second insulator layers and embedded semiconductor nanoparticles therein. Back gate electrodes are formed underneath the buried insulator layer, and shallow trench isolation structures are formed to isolate the back gate electrodes. Field effect transistors are formed in a memory device region and a logic device region employing same processing steps. The embedded nanoparticles can be employed as a charge storage element of non-volatile memory devices, in which charge carriers tunnel through the second insulator layer into or out of the semiconductor nanoparticles during writing and erasing.

According to an aspect of the present disclosure, a semiconductor structure includes a non-volatile memory element. The non-volatile memory element includes a field effect transistor, which includes a source region, a drain region, and a body region that are located within a portion of a semiconductor layer. The non-volatile memory element further includes a buried insulator layer underlying the semiconductor layer. In addition, the non-volatile memory element includes semiconductor nanoparticles embedded within the buried insulator layer.

According to another aspect of the present disclosure, a semiconductor structure includes a stack, from bottom to top, of a handle substrate, a buried insulator layer, and a top semiconductor layer. The buried insulator layer includes embedded semiconductor nanoparticles located on a plane between a topmost surface of the buried insulator layer and a bottommost surface of the buried insulator layer.

According to yet another aspect of the present disclosure, a method of forming a semiconductor material is provided. Semiconductor nanoparticles are deposited on a surface of a first insulator layer located on a handle substrate. A second insulator layer is deposited over the semiconductor nanoparticles. A top semiconductor layer is bonded to the second insulator layer. A semiconductor-on-insulator substrate is formed, which includes a stack, from bottom to top, of the handle substrate, a buried insulator layer including the first insulator layer and the second insulator layer, and the top semiconductor layer.

BRIEF DESCRIPTION OF SEVERAL VIEWS OF THE DRAWINGS

FIG. 1 is a vertical cross-sectional view of a first exemplary semiconductor structure after providing a substrate including a handle substrate and a first insulator layer located thereupon according to a first embodiment of the present disclosure.

FIG. 2 is a vertical cross-sectional view of the first exemplary semiconductor structure after deposition of semiconductor nanoparticles according to the first embodiment of the present disclosure.

FIG. 3 is a vertical cross-sectional view of the first exemplary semiconductor structure after deposition of a second insulator layer according to the first embodiment of the present disclosure.

FIG. 4 is a vertical cross-sectional view of the first exemplary semiconductor structure after bonding a substrate including a top semiconductor layer and a carrier substrate according to the first embodiment of the present disclosure.

FIG. 5 is a vertical cross-sectional view of the first exemplary semiconductor structure after cleaving of the carrier substrate from the semiconductor layer according to the first embodiment of the present disclosure.

FIG. 6 is a vertical cross-sectional view of the first exemplary semiconductor structure after formation of a back gate layer according to the first embodiment of the present disclosure.

FIG. 7 is a vertical cross-sectional view of the first exemplary semiconductor structure after formation of first shallow trenches according to the first embodiment of the present disclosure.

FIG. 8 is a vertical cross-sectional view of the first exemplary semiconductor structure after formation of second shallow trenches according to the first embodiment of the present disclosure.

FIG. 9 is a vertical cross-sectional view of the first exemplary semiconductor structure after formation of shallow trench isolation structures according to the first embodiment of the present disclosure.

DETAILED DESCRIPTION

Figure 10:
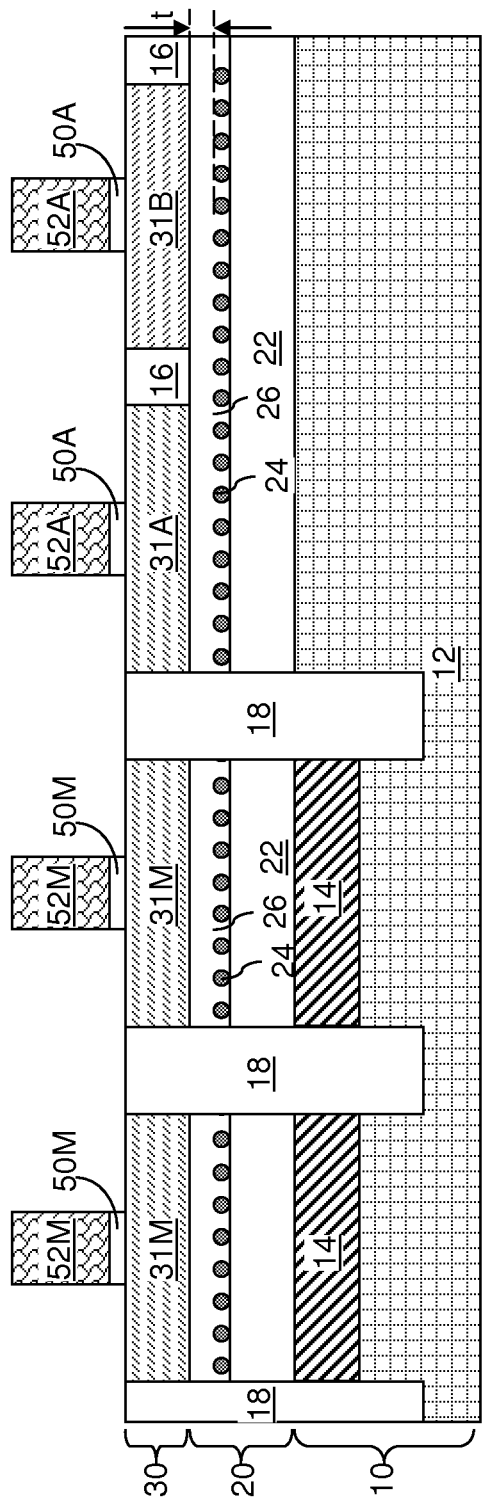
FIG. 10 is a vertical cross-sectional view of the first exemplary semiconductor structure after formation of gate stacks according to the first embodiment of the present disclosure.

As stated above, the present disclosure relates to non-volatile memory devices employing semiconductor nanoparticles, semiconductor substrates including embedded semiconductor nanoparticles within a buried insulator layer, and methods of manufacturing the same, which are now described in detail with accompanying figures. It is noted that like reference numerals refer to like elements across different embodiments. The drawings are not necessarily drawn to scale.

Referring to FIG. 1, a first exemplary semiconductor structure according to a first embodiment of the present disclosure includes a substrate, which includes a handle substrate 10 and a first insulator layer 22 located thereupon, The handle substrate 10 can include a semiconductor material, a conductive material, and/or a dielectric material. The handle substrate 10 provides mechanical support to the first insulator layer 22. The thickness of the handle substrate 10 can be from 30 microns to 2 mm, although lesser and greater thicknesses can also be employed.

In one embodiment, the handle substrate 10 includes a semiconductor material layer, which is herein referred to as a bottom semiconductor layer 12. The bottom semiconductor layer 12 can include a single crystalline semiconductor material or a polycrystalline semiconductor material. In one embodiment, the bottom semiconductor layer 12 includes single crystalline semiconductor material. In one embodiment, the bottom semiconductor layer 12 includes single crystalline silicon.

The first insulator layer 22 includes a dielectric material, which is herein referred to as a first dielectric material. Non-limiting examples of the first dielectric material include silicon oxide, silicon nitride, silicon oxynitride, a dielectric metal oxide, a dielectric metal nitride, a dielectric metal oxynitride, or a combination thereof. The thickness of the first insulator layer 22 can be selected such that quantum tunneling of charge carriers (e.g., electrons or holes) does not occur across the first insulator layer 22. For example, the thickness of the first insulator layer 22 can be greater than 5 nm, although lesser and greater thicknesses can also be employed. In one embodiment, the thickness of the first insulator layer 22 can be from 5 nm to 300 nm. In another embodiment, the thickness of the first insulator layer 22 can be from 5 nm to 20 nm.

In one embodiment, the first insulator layer 22 can be formed by depositing a dielectric material on the top surface of the handle substrate 10, for example, by chemical vapor deposition or spin-coating. In another embodiment, at least a top portion of the handle substrate 10 can include a semiconductor material, and the first insulator layer 22 can be formed by converting the top portion of the handle substrate 10 into a dielectric material by thermal oxidation, thermal nitridation, plasma oxidation, plasma nitridation, or a combination thereof. In a non-limiting example, the handle substrate 10 can include silicon, and the first insulator layer 22 can include silicon oxide formed by oxidation of a top portion of the handle substrate 10. In yet another embodiment, the first insulator layer 22 can be formed by a combination of conversion of a top portion of the handle substrate 10 into a dielectric material and deposition of another dielectric material thereupon. In one embodiment, the top surface of the first insulator layer can be planar, i.e., located within a single horizontal plane.

Referring to FIG. 2, semiconductor nanoparticles 24 are deposited on the top surface of the first insulator layer 22. As used herein, "semiconductor nanoparticles" refer to particles of a semiconductor material having a lateral dimension between 1 nm and 10 nm. The semiconductor nanoparticles 24 can include an elemental semiconductor material such as silicon or germanium, or can include a compound semiconductor material such as GaAs or InAs. The semiconductor nanoparticles 24 may be substantially spherical, in which case the lateral dimension of each semiconductor nanoparticle 24 can be the diameter of the semiconductor nanoparticles 24. The semiconductor nanoparticles 24 can be non-spherical, in which case the lateral dimension of each semiconductor nanoparticle 24 can be the maximum distance between two points on the surface of the semiconductor nanoparticle 24.

The semiconductor nanoparticles 24 can be deposited, for example, by physical vapor deposition (PVD), in which particles of a semiconductor material are sputtered onto the top surface of the handle substrate 10. The sputter conditions and the composition of the sputter target can be selected such that the size (i.e., lateral dimension) of the sputtered particles from a target including a semiconductor material is within the range from 1 nm to 10 nm. For example, if the semiconductor nanoparticles 24 are silicon nanoparticles, the sputter target can contain amorphous silicon or microcrystalline silicon.

The amount of the sputtered semiconductor nanoparticles 24 is controlled such that the semiconductor nanoparticles 24 do not form a continuous layer on the top surface of the first insulator layer 22. The duration of the sputtering process during deposition of the semiconductor nanoparticles 24 can be from 0.1 second to 10 seconds, although lesser and greater time intervals can also be employed. If the top surface of the first insulator layer 22 is planar, the bottommost surfaces of the semiconductor nanoparticles 24 can be coplanar, i.e., located within the same horizontal plane.

Referring to FIG. 3, a second dielectric material is deposited over the semiconductor nanoparticles 24 to form a second insulator layer 26. The second dielectric material can be the same as, or can be different from, the first dielectric material of the first insulator layer 22. Non-limiting examples of the first dielectric material include silicon oxide, silicon nitride, silicon oxynitride, a dielectric metal oxide, a dielectric metal nitride, a dielectric metal oxynitride, or a combination thereof. The thickness t of the second insulator layer 26 can be selected such that quantum tunneling of charge carriers (e.g., electrons or holes) can occur through the second insulator layer 26. For example, the thickness t of the second insulator layer 26 can be from 1 nm to 5 nm, although lesser and greater thicknesses can also be employed. In one embodiment, the thickness t of the second insulator layer 26 can be from 1.5 nm to 4 nm.

In one embodiment, the second insulator layer 26 can be formed by depositing a dielectric material on the top surface of the semiconductor nanoparticles 24 and the first insulator layer 22, for example, by chemical vapor deposition or spin-coating. The semiconductor nanoparticles 24 are spaced from the top surface of the second insulator layer 26 by a distance through which charge carriers can tunnel by quantum tunneling.

The first insulator layer 22 and the second insulator layer 26 are collectively referred to as a buried insulator layer 20 because a top semiconductor layer (not shown in FIG. 3) is subsequently formed on the combination of the first and second insulator layers (22, 26) and the combination of the first and second insulator layers (22, 26) are subsequently placed between the handle substrate 10 and the top semiconductor layer. In other words, the buried insulator layer 20 includes the first buried insulator layer 22 having a topmost surface that is in contact with bottommost surfaces of the embedded semiconductor nanoparticles 24, and the second buried insulator layer 26 that overlies the embedded semiconductor nanoparticles 24.

In one embodiment, the embedded semiconductor nanoparticles 24 can have lateral dimensions in a range from 1 nm to 10 nm. The embedded semiconductor nanoparticles 24 can include an elemental semiconductor material or a compound semiconductor material. For example, the embedded semiconductor nanoparticles 24 can be silicon nanoparticles, germanium nanoparticles, GaAs nanoparticles, or nanoparticles of any other semiconductor material. The embedded semiconductor nanoparticles 24 can be vertically spaced from the topmost surface of the buried insulator layer 20 by a spacing (which is the same as the thickness t of the second insulator layer 26) in a range from 1 nm to 5 nm. The bottommost surfaces of the embedded semiconductor nanoparticles 24 can be coplanar. In one embodiment, the topmost surfaces of the embedded semiconductor nanoparticles may not be coplanar due to variations in the dimensions of the embedded semiconductor nanoparticles 24.

The embedded semiconductor nanoparticles 24 are embedded within the buried insulator layer as discrete particles that do not form a continuous layer. The embedded semiconductor nanoparticles 24 laterally extend throughout the entire lateral extent of the buried insulator layer 20.

In one embodiment, each of the first buried insulator layer 22 and the second buried insulator layer 26 can include a dielectric material independently selected from silicon oxide, silicon nitride, silicon oxynitride, a dielectric metal oxide, a dielectric metal nitride, and a dielectric metal oxynitride. In one embodiment, the first buried insulator layer 22 and the second buried insulator layer 26 can include different dielectric materials. In another embodiment, the first buried insulator layer 22 and the second buried insulator layer 26 can include the same dielectric material.

Referring to FIG. 4, a substrate 99 including a semiconductor material layer 30L and a carrier substrate 90 are bonded to the buried insulator layer 20. The substrate 99 can be a semiconductor substrate including a hydrogen implantation layer 29, which can be formed by implantation of hydrogen atoms into the substrate 99 at a uniform depth from a surface of the substrate 99 as known in the art. The semiconductor material layer 30L is located on one side of the hydrogen implantation layer 29, and the carrier substrate 90 is located on the other side of the hydrogen implantation layer 29.

The substrate 99 is placed on the buried insulator layer 20 such that a surface of the semiconductor material layer 30L contacts a surface of the second insulator layer 26. The semiconductor material layer 30L can be bonded to the second insulator layer 26 employing any bonding methods known in the art. For example, if the semiconductor material layer 30L includes silicon and if the second insulator layer 20 includes silicon oxide, the bonding between the semiconductor material layer 30L and the second insulator layer 26 can be performed employing any method for bonding silicon and silicon oxide as known in the art including, but not limited to, an anneal at an elevated temperature and surface activation.

Referring to FIG. 5, the carrier substrate 90 is cleaved off the semiconductor material layer 30L at the hydrogen implantation layer 29, for example, by a low temperature anneal, for example, between 200° C. and 300° C. A semiconductor-on-insulator (SOI) substrate is provided, which includes a stack, from bottom to top, of the handle substrate 10, the buried insulator layer 20, and a top semiconductor layer 30 that includes the semiconductor material layer 30L. The buried insulator layer 20 includes embedded semiconductor nanoparticles 24 located on the plane between the topmost surface of the buried insulator layer 20 and the bottommost surface of the buried insulator layer 20.

Referring to FIG. 6, if the handle substrate 10 includes the bottom semiconductor layer 12, dopants can be implanted into an upper portion of the bottom semiconductor layer 12 to form a back gate layer 14L. A patterned implantation mask layer (not shown) such as a patterned photoresist layer can be employed to form the back gate layer 14L as a patterned layer that is present in one region of the handle substrate 10, and not present in another region of the handle substrate 10. P-type dopants or n-type dopants are implanted through the semiconductor material layer 30L and the buried insulator layer 20 and into the upper portion of the bottom semiconductor layer 12. The thickness of the back gate layer 14L can be from 50 nm to 1,000 nm, although lesser and greater thicknesses can also be employed. The dopant concentration in the back gate layer 14L can be from $1.0 \times 10^{19}/cm^3$ to $3.0 \times 10^{21}/cm^3$, although lesser and greater dopant concentrations can also be employed.

In one embodiment, the bottom semiconductor layer 12 can include an intrinsic semiconductor material. In another embodiment, the bottom semiconductor layer 12 can have a doping of a first conductivity type (i.e., p-type or n-type), and the back gate layer 14L can have a doping of a second conductivity type that is the opposite of the first conductivity type. For example, if the first conductivity type is p-type, the second conductivity type is n-type, and vice versa.

Various portion of the semiconductor material layer 30A can be doped with p-type dopants or n-type dopants to form various semiconductor material portions, which can include a first semiconductor material portion 30A having a doping of one conductivity type and a second semiconductor material portion 30B having a doping of the opposite conductivity type. In one embodiment, the first semiconductor material portion 30A can have a doping of the first conductivity type and the second semiconductor material portion 30B can have a doping of the second conductivity type. In another embodiment, the first semiconductor material portion 30A can have a doping of the second conductivity type and the second semiconductor material portion 30B can have a doping of the first conductivity type.

Referring to FIG. 7, a first photoresist layer 27 can be applied over the top semiconductor layer 30 and lithographically patterned within a pattern. The pattern can include at least one opening overlying an area between adjacent semiconductor devices to be formed. In one embodiment, the pattern can include openings overlying boundaries among semiconductor devices to be subsequently formed in the regions that do not overlie the back gate layer 14L.

Portions of the top semiconductor layer 30 underlying the openings in the first photoresist layer 27 are removed by an etch, which can be an anisotropic etch such as a reactive ion etch or an isotropic etch such as a wet etch. The first photoresist layer 27 is employed as an etch mask during the etch. First shallow trenches 15 are formed by the etch. The first shallow trenches extend from the top surface of the top semiconductor layer 30 at least to the bottom surface of the top semiconductor layer 30. The first photoresist layer 27 is subsequently removed, for example, by ashing.

Referring to FIG. 8, a second photoresist layer 37 can be applied over the top semiconductor layer 30 and lithographically patterned within a pattern. The pattern can include at least one opening overlying an area between adjacent semiconductor devices to be formed. In one embodiment, the pattern can include openings overlying boundaries among semiconductor devices to be subsequently formed in the region overlying the back gate layer 14.

The materials of the top semiconductor layer 30, the buried insulator layer 20, the back gate layer 14, and upper portions of the bottom semiconductor layer 12 underlying the back gate layer 14 are etched by an etch that employed the second photoresist layer 37 as an etch. The etch can be an anisotropic etch such as a reactive ion etch. Second shallow trenches 17 are formed by the etch. The second shallow trenches 17 extend from the top surface of the top semiconductor layer 30 to a depth below the bottom surface of the back gate layer 14. The second photoresist layer 37 is subsequently removed, for example, by ashing.

In one embodiment, the processing steps of FIG. 7 can be omitted, and the processing steps of FIG. 8 can be employed to form shallow trenches in areas of the first shallow trenches 15 and the second shallow trenches 17. In this embodiment, all shallow trenches can extend below the plane of the bottom surface of the back gate layer 14L.

The back gate layer 14L can be divided into a plurality of disjoined portions that are laterally surrounded by the second shallow trenches 17. Each disjoined portion of the back gate layer 14 after formation of the second shallow trenches 17 is herein referred to as a back gate electrode 14, which is subsequently employed to electrically bias semiconductor devices such as field effect transistors from below the buried insulator layer 20. Each back gate electrode 14 is embedded within the handle substrate 10, and underlies a portion of the top semiconductor layer 30.

The first semiconductor material portion 30A can be divided into a plurality of disjoined semiconductor material portions. The portions of the first semiconductor material portion 30A that overlie the back gate electrodes 14 can be subsequently employed to form non-volatile memory devices, and are herein referred to as memory-device semiconductor material portions 31M, i.e., semiconductor material portions employed for memory devices.

Referring to FIG. 9, various shallow trench isolation structures can be formed by filling the first shallow trenches 15 and the second shallow trenches 17 with at least one dielectric material. The dielectric material can include silicon oxide, silicon nitride, silicon oxynitride, a dielectric metal oxide, a dielectric metal nitride, or a combination thereof. The dielectric material can be deposited, for example, by chemical vapor deposition (CVD), atomic layer deposition (ALD), spin-coating, or a combination thereof. The excess dielectric material deposited over the top surface of the top semiconductor layer 30 is removed, for example, by a recess etch, chemical mechanical planarization (CMP), or a combination thereof. The dielectric material that fills the first trenches 15 constitute first shallow trench isolation structures 16, and the dielectric material that fills the second trenches 17 constitute second shallow trench isolation structures 18. Each shallow trench isolation structure (16, 18) can laterally surround one of the first semiconductor material portions 31A, second semiconductor material portions 31B, and the memory-device semiconductor material portions 31M.

Referring to FIG. 10, various gate stacks can be formed over the various semiconductor material portions (31A, 31B, 31M) employing methods known in the art. Logic-type gate stacks can be formed over the first and second semiconductor material portions (31A, 31B), and memory-type gate stacks can be formed over the memory-device semiconductor material portions 31M. Each logic-type gate stack can include a logic-type gate dielectric 50A and a logic-type gate electrode 52A. Each memory-type gate stack can include a memory-type gate dielectric 50M and a memory-type gate electrode 52M.

Each of the logic-type gate dielectrics 50A and the memory-type gate dielectrics 50M can include any gate dielectric material known in the art including, but not limited to, silicon oxide, silicon nitride, silicon oxynitride, a dielectric metal oxide, a dielectric metal nitride, a dielectric metal oxynitride, or a combination thereof. The logic-type gate dielectrics 50A and the memory-type gate dielectrics 50M may, or may not, include the same dielectric material.

In one embodiment, the logic-type gate electrodes 52A and the memory-type gate electrodes 52M can have the same thickness. For example, the logic-type gate electrodes 52A and the memory-type gate electrodes 52M can be formed by deposition of a gate electrode material layer (which can include at least one metallic material and/or at least one semiconductor material), and by patterning and optional dopant implantation of the gate electrode material layer. In this case, the logic-type gate electrodes 52A and the memory-type gate electrodes 52M can have the same height. The composition of the logic-type gate electrodes 52A and the memory-type gate electrodes 52M may be the same, or may differ only by the concentration of electrical dopants (i.e., p-type dopants and n-type dopants).

If the logic-type gate electrodes 52A and the memory-type gate electrodes 52M have the same thickness, the height of the logic-type gate stack (50A, 52A) and the height of the memory-type gate stack (50M, 52M) can be substantially the same, i.e., differ only by the difference between the thickness of the logic-type gate dielectrics 50A and the thickness of the memory-type gate dielectrics 50M. In this case, the variation in the height of the various gate stacks (50A, 52A, 50M, 52M) can be minimized, which can increase lithographic process windows in subsequent processing steps and reduce the topographical variations of surfaces to be subsequently planarized (e.g., surfaces of a contact-level dielectric material layer to be subsequently deposited over the various gate stacks (50A, 52A, 50M, 52M)).

Figure 11:
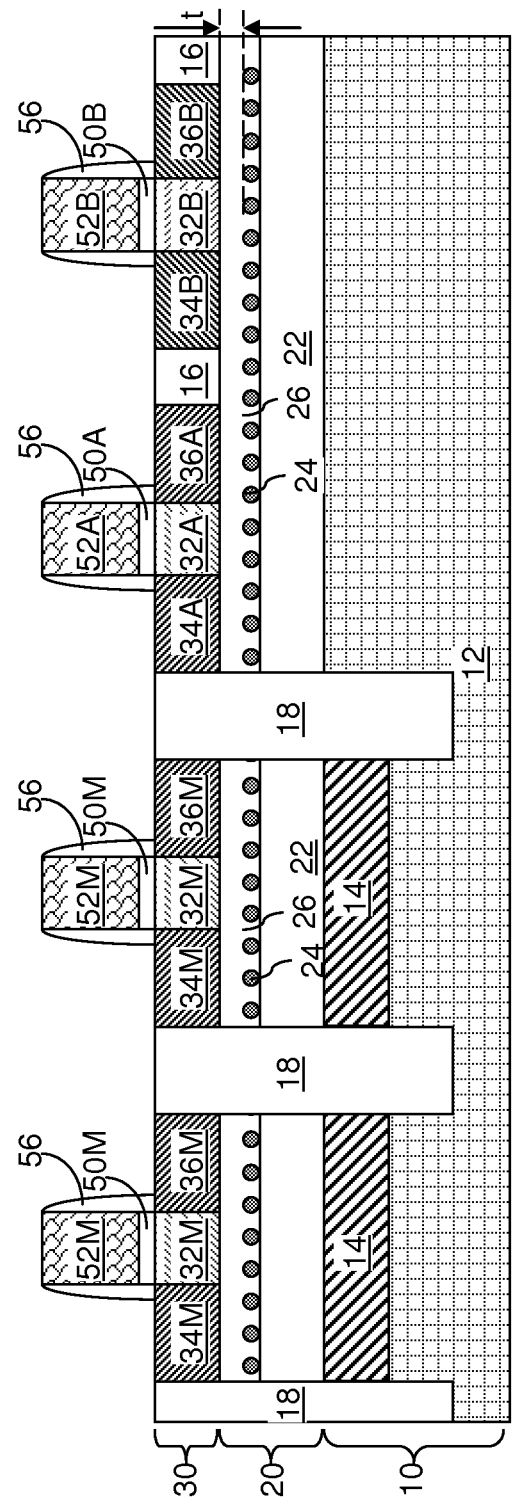
FIG. 11 is a vertical cross-sectional view of the first exemplary semiconductor structure after formation of field effect transistors according to the first embodiment of the present disclosure.

Referring to FIG. 11, various source regions, drain regions, and gate spacers 56 can be subsequently formed. As used herein, "source regions" include source extension regions and/or raised source regions as known in the art, and "drain regions" include drain extension regions and/or raised drain regions as known in the art. Various field effect transistors are thus formed.

The various field effect transistors can include a first logic field effect transistor including a body region (herein referred to as a first body region 32A), a source region (herein referred to as a first source region 34A), a drain region (herein referred to as a first drain region 36A), a logic-type gate dielectric 50A overlying the first body region 32A, and a logic-type gate electrode 52A overlying the first body region 32A. The various field effect transistors can further include a second logic field effect transistor including a body region (herein referred to as a second body region 32B), a source region (herein referred to as a second source region 34B), a drain region (herein referred to as a second drain region 36B), a logic-type gate dielectric 50A overlying the second body region 32B, and a logic-type gate electrode 52A overlying the second body region 32B. In addition, the various field effect transistors can include non-volatile memory field effect transistors, each of which includes a body region (herein referred to as a memory body region 32M), a source region (herein referred to as a memory source region 34M), a drain region (herein referred to as a memory drain region 36M), a memory-type gate dielectric 50M overlying the memory body region 32M, and a memory-type gate electrode 52M overlying the memory body region 32M.

In one embodiment, one of the first and second logic field effect transistors can be a p-type field effect transistor, and the other of the first and second logic field effect transistors can be an n-type field effect transistor. A plurality of first logic field effect transistors and/or a plurality of second logic field effect transistors can be formed to provide complementary metal-oxide-semiconductor (CMOS) logic circuits.

Semiconductor nanoparticles 24 are present underneath the memory body region 32M of each non-volatile memory field effect transistor. In one embodiment, the non-volatile memory field effect transistor can be a fully depleted device, i.e., a device in which the memory source region 34M and the memory drain region 36M is in contact with the buried insulator layer 20. As discussed above, the second insulator layer 26 has a thickness that enables charge carriers to tunnel through the second insulator layer 26 by quantum tunneling. Thus, the semiconductor nanoparticles 24 are spaced from the top semiconductor layer 30 by a distance through which charge carriers tunnel by quantum tunneling.

The non-volatile memory field effect transistor can be operated with bias conditions that induce injection of charge carries into the buried insulator layer 20 and to induce tunneling of the charge carriers through the second insulator layer 26 and into the semiconductor nanoparticles 24. In this case, the semiconductor nanoparticles 24 can store the charge carriers (i.e., electrons or holes), and is electrically charged with a positive voltage or a negative voltage. The positive voltage or negative voltage present at the semiconductor nanoparticles 24 injected with charge carriers through quantum tunneling alters the threshold voltage of the non-volatile memory field effect transistor. By measuring the threshold voltage of the non-volatile memory field effect transistor, the charge state of the semiconductor nanoparticles 24 underneath the non-volatile memory field effect transistor can be determined. Thus, the semiconductor nanoparticles 24 function as a bit information storage element for the non-volatile memory field effect transistor.

The back gate electrode 14 that is present underneath the memory body region 32B of each non-volatile memory field effect transistor can be provided with suitable electrical contacts employing methods known in the art, and electrically biased to repel electrical charges stored in the overlying semiconductor nanoparticles 24 into the memory body region 32B above the semiconductor nanoparticles 24 by quantum tunneling. Thus, the back gate electrode 14 can be employed to "erase" the information stored in the semiconductor nanoparticles 24, i.e., to remove the electrical charges by causing quantum tunneling of the electrical charges into the overlying memory base region 32M.

In one embodiment, semiconductor nanoparticles 24 are present under the portion of the portion of the top semiconductor layer 30 that includes the source regions (34A, 34B), the drain regions (36A, 36B), and the body regions (32A, 32B) of first and second field effect transistors. In one embodiment, the non-volatile memory field effect transistors and the first and second field effect transistors can have gate stacks that have the same thickness and include the same materials. Various shallow trench isolation structures (16, 28) can laterally surround the source region, the drain region, the body region of the various field effect transistors.

Figure 12:
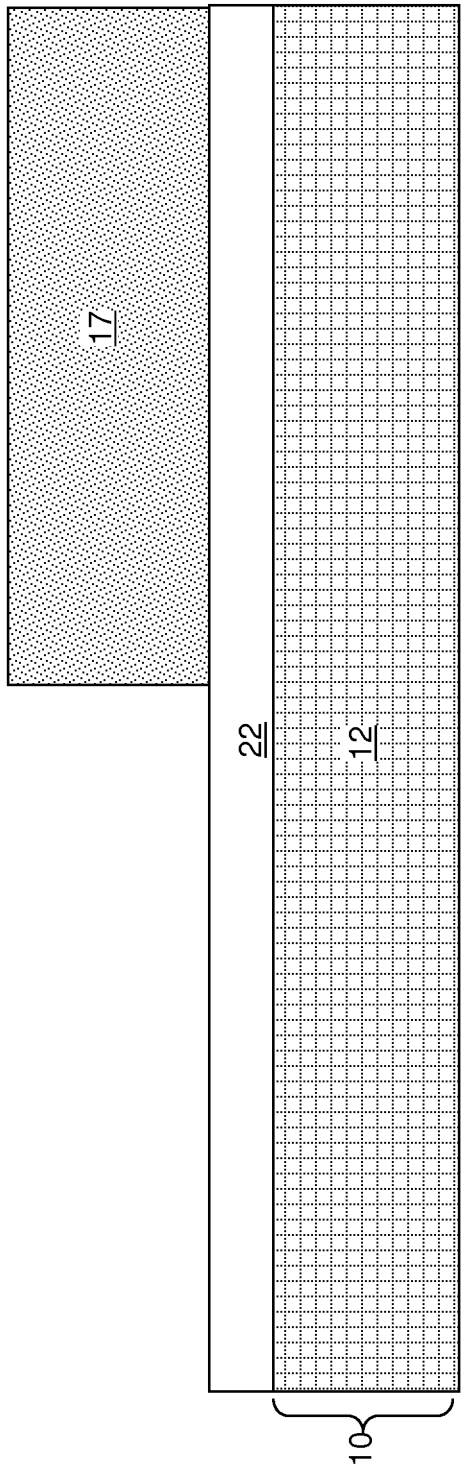
FIG. 12 is a vertical cross-sectional view of a second exemplary semiconductor structure after formation of a patterned masking layer according to a second embodiment of the present disclosure.

In some structures, the semiconductor nanoparticles 24 may not extend throughout the entirety of the buried insulator layer 20, but may be present only in the region of the non-volatile memory field effect transistors. Referring to FIG. 12, a second exemplary semiconductor structure according to a second embodiment of the present disclosure can be derived from the first exemplary structure of FIG. 1 by forming a patterned masking layer 17 over a first portion of the top surface of the first insulator layer 22. A second portion (which is the complement of the first portion) of the first insulator layer 22 is not covered by the patterned masking layer 17.

In one embodiment, the patterned masking layer 17 can be a patterned photoresist layer. The thickness of the patterned photoresist layer can be from 30 nm to 1,000 nm, although lesser and greater thicknesses can also be employed.

In another embodiment, the patterned masking layer 17 can be a patterned hard mask layer including a material that can be removed selective to the dielectric material of the first insulator layer 22 and the semiconductor material of the semiconductor nanoparticles 24. In one embodiment, the patterned masking layer 17 can include a dielectric material different from the dielectric material of the first insulator layer 22. For example, the first insulator layer 22 can include silicon oxide and the patterned hard mask layer 17 can include silicon nitride. The thickness of the patterned hard mask layer can be from 1 nm to 100 nm, although lesser and greater thicknesses can also be employed.

Figure 13:
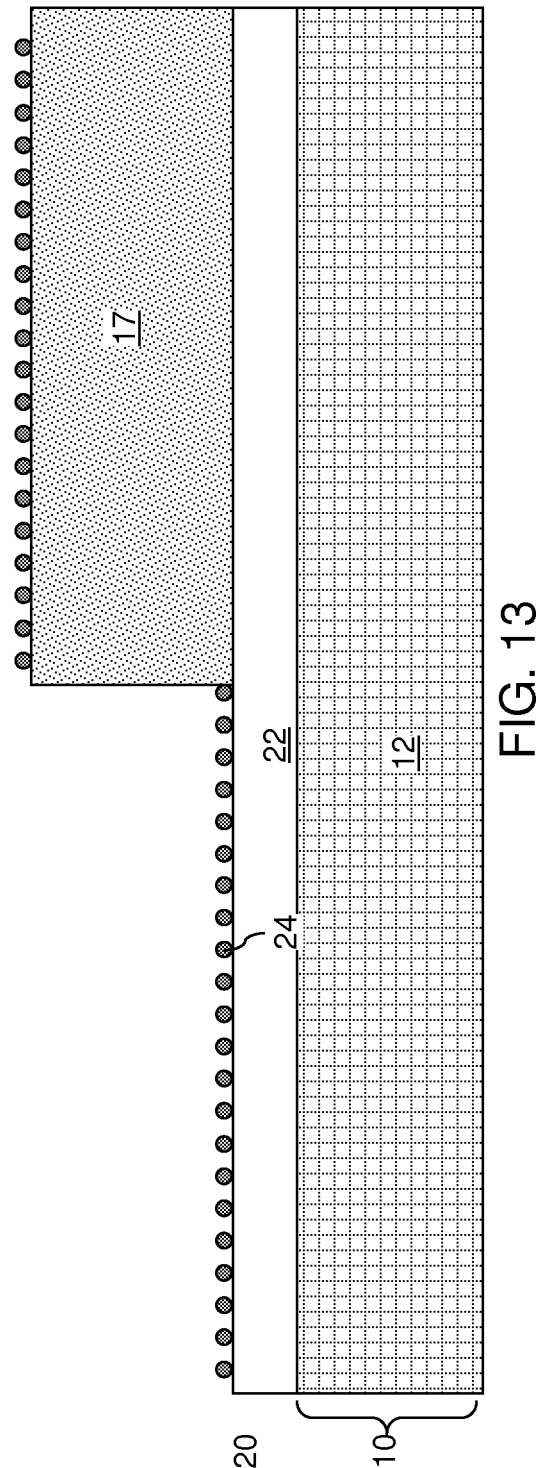
FIG. 13 is a vertical cross-sectional view of the second exemplary semiconductor structure after deposition of semiconductor nanoparticles according to the second embodiment of the present disclosure.

Referring to FIG. 13, the processing step of FIG. 2 can be performed to deposit semiconductor nanoparticles 24. The semiconductor nanoparticles are deposited directly on the second portion of the first insulator layer 22 and on the top surface of the patterned masking layer 17. The semiconductor nanoparticles deposited on the top surface of the patterned masking layer 17 is vertically spaced from the first insulator layer 22 by the thickness of the patterned masking layer 17.

Figure 14:
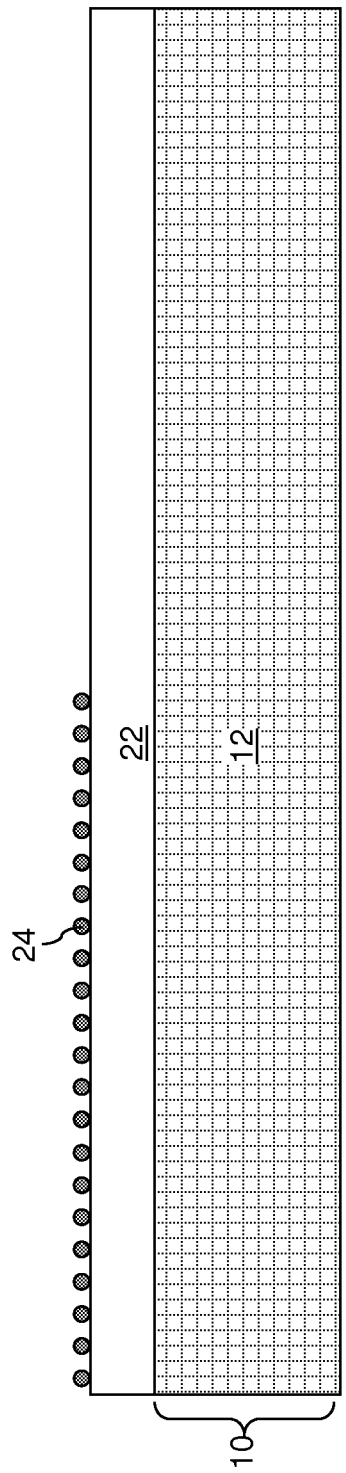
FIG. 14 is a vertical cross-sectional view of the second exemplary semiconductor structure after removal of the patterned masking layer according to the second embodiment of the present disclosure.

Referring to FIG. 14, the patterned masking layer 17 is removed selective to the first insulator layer 22 and the semiconductor nanoparticles 24. In one embodiment, the patterned masking layer 17 can be lifted off with the semiconductor nanoparticles 24 thereupon. In another embodiment, the patterned masking layer 17 can be dissolved in a solution that does not etch the semiconductor particles 24 in an orientation that causes the semiconductor nanoparticles 24 not to fall on the first insulator layer 22 (e.g., by holding the handle substrate 10 upside down or sideways).

Figure 15:
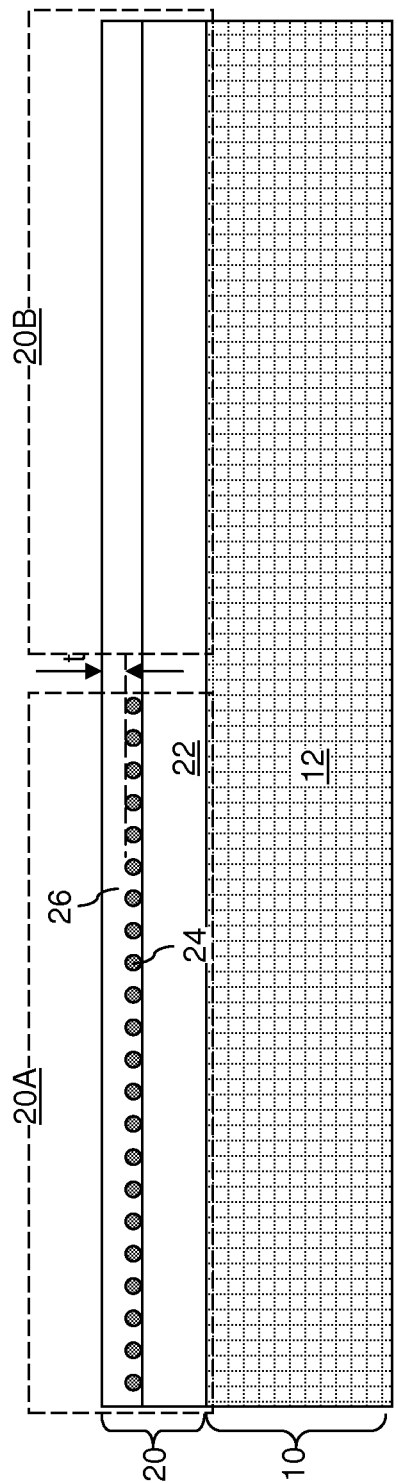
FIG. 15 is a vertical cross-sectional view of the second exemplary semiconductor structure after formation of a second insulator layer according to the second embodiment of the present disclosure.

Referring to FIG. 15, the processing steps of FIG. 3 can be performed to deposit a second insulator layer 26. The buried insulator layer 20 embeds the semiconductor nanoparticles 24 in a first portion 20A thereof, and does not embed any semiconductor nanoparticle in a second portion 20B thereof.

Figure 16:
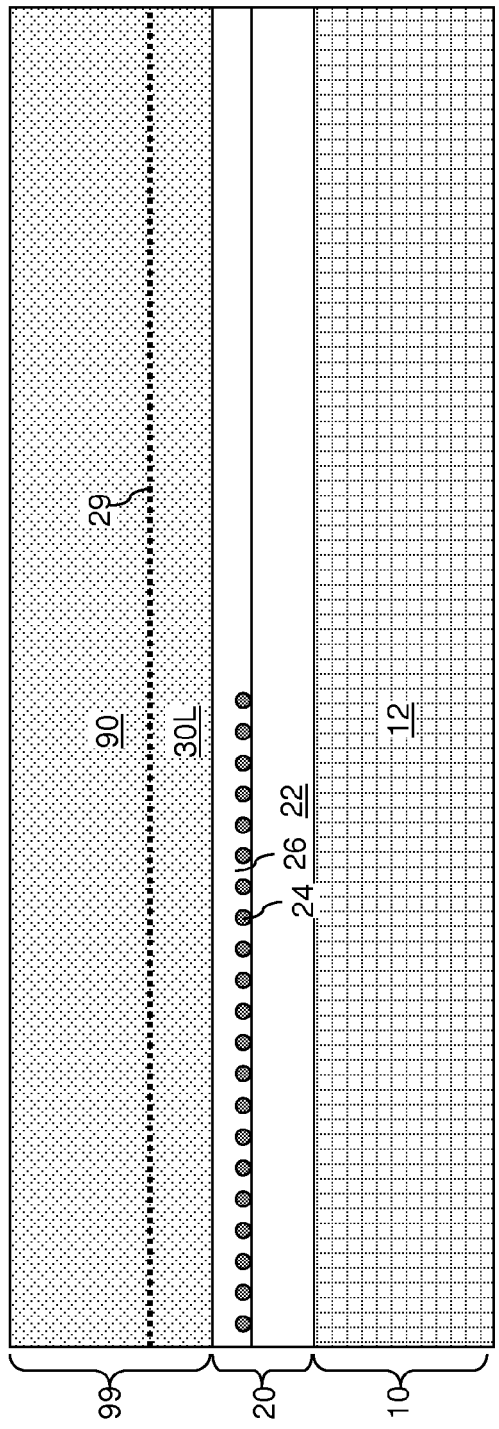
FIG. 16 is a vertical cross-sectional view of the second exemplary semiconductor structure after bonding a substrate including a semiconductor layer and a carrier substrate according to the second embodiment of the present disclosure.

Referring to FIG. 16, the processing steps of FIG. 4 can be performed to bond a substrate 99 including a semiconductor material layer 30L and a carrier substrate 90 to the second insulator layer 26.

Figure 17:
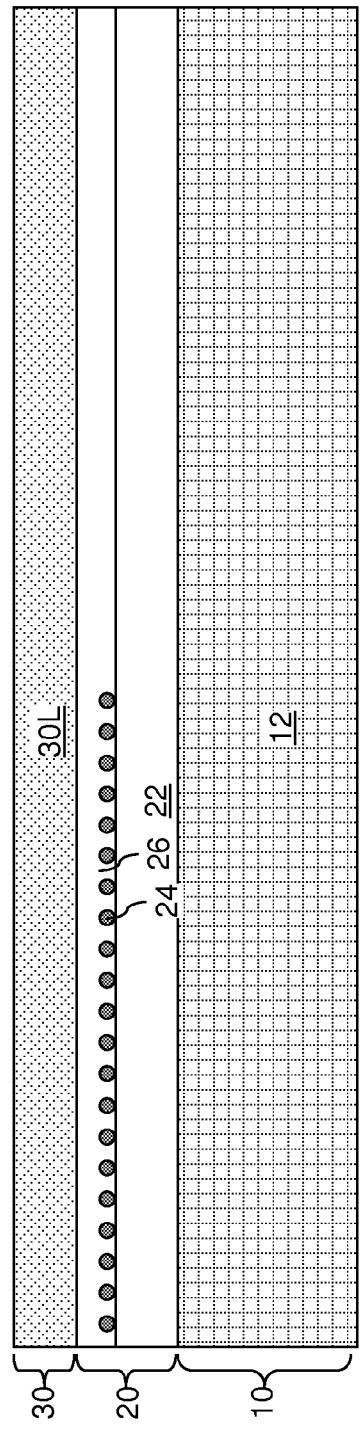
FIG. 17 is a vertical cross-sectional view of the second exemplary semiconductor structure after cleaving off the carrier substrate according to the second embodiment of the present disclosure.

Referring to FIG. 17, the processing steps of FIG. 5 can be performed to provide an SOI substrate that includes the handle substrate 10, the buried insulator layer 20, and the top semiconductor layer 30. The carrier substrate 90 is cleaved off the semiconductor material layer 30L. The semiconductor nanoparticles 24 are embedded in the first portion of the buried insulator layer 20, which is laterally spaced from the second portion of the buried insulator layer 20 that does not include any embedded semiconductor nanoparticles.

Figure 18:
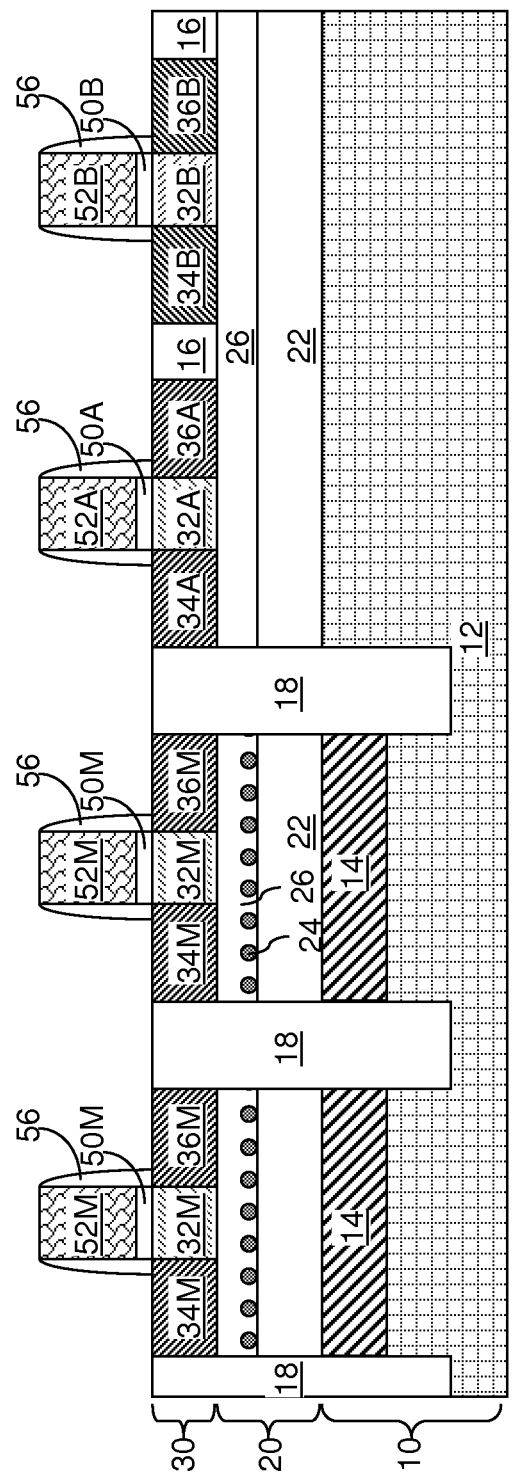
FIG. 18 is a vertical cross-sectional view of the second exemplary semiconductor structure after formation of field effect transistors according to the second embodiment of the present disclosure.

Referring to FIG. 18, field effect transistors can be formed, for example, by performing the processing steps of FIGS. 6, 7, 8, 9, 10, and 11. Semiconductor nanoparticles are not present underneath the first and second field effect transistors, while semiconductor nanoparticles 24 are present underneath non-volatile memory field effect transistors and function as the bit information storage elements for the non-volatile memory field effect transistors.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor structure comprising:
   a non-volatile memory element, said non-volatile memory element comprising:
      a field effect transistor including a source region, a drain region, and a body region that are located within a portion of a semiconductor layer,
      a gate electrode that is located above said body portion of said semiconductor layer, and
      semiconductor nanoparticles embedded within a portion of a buried insulator layer underlying said semiconductor layer as discrete particles that do not form a continuous layer, located underneath said source region, said drain region, and said body region, and vertically spaced from said gate electrode by at least said body region; and
   a logic element, said logic element comprising:
      another field effect transistor comprising another source region, another drain region, and another body region that are located within another portion of said semiconductor layer, and
      another gate electrode that is located above said another body region,
   wherein said semiconductor nanoparticles are not present within another portion of said buried insulator layer located underneath said another source region, said another drain region, and said another body region of said another field effect transistor, and
   wherein said gate electrode and said another gate electrode have a substantially same height.

2. The semiconductor structure of claim 1, wherein said semiconductor nanoparticles are spaced from said semiconductor layer by a distance through which charge carriers tunnel by quantum tunneling.

3. The semiconductor structure of claim 1, wherein said buried insulator layer comprises:
   a first buried insulator layer having a topmost surface in contact with bottommost surfaces of said embedded semiconductor nanoparticles; and
   a second buried insulator layer overlying said embedded semiconductor nanoparticles.

4. The semiconductor structure of claim 3, wherein said first buried insulator layer and said second buried insulator layer comprise different dielectric materials.

5. The semiconductor structure of claim 1, wherein said non-volatile memory element is isolated from said logic element by a shallow trench isolation structure extending below a bottommost surface of said buried insulator layer.

6. The semiconductor structure of claim 1, further comprising a handle substrate located underneath said buried insulator layer, wherein a back gate electrode is embedded within said handle substrate and underlies said body region.

7. The semiconductor structure of claim 1, wherein said field effect transistor and said another field effect transistor have gate stacks having a same thickness and comprising same materials.

8. The semiconductor structure of claim 1, wherein said semiconductor nanoparticles are embedded in said buried insulator layer, and are located on a plane between a topmost surface of said buried insulator layer and a bottommost surface of said buried insulator layer.

9. The semiconductor structure of claim 8, wherein said embedded semiconductor nanoparticles have lateral dimensions in a range from 1 nm to 10 nm.

10. The semiconductor structure of claim 8, wherein said embedded semiconductor nanoparticles comprise an elemental semiconductor material or a compound semiconductor material.

11. The semiconductor structure of claim 8, wherein said embedded semiconductor nanoparticles are vertically spaced from said topmost surface of said buried insulator layer by a spacing in a range from 1 nm to 5 nm.

12. The semiconductor structure of claim 8, wherein bottommost surfaces of said embedded semiconductor nanoparticles are coplanar.

13. The semiconductor structure of claim 8, wherein said buried insulator layer comprises:
   a first buried insulator layer having a topmost surface in contact with bottommost surfaces of said embedded semiconductor nanoparticles; and
   a second buried insulator layer overlying said embedded semiconductor nanoparticles.

14. The semiconductor structure of claim 13, wherein said first buried insulator layer and said second buried insulator layer comprise different dielectric materials.

15. The semiconductor structure of claim 13, wherein each of said first buried insulator layer and said second buried insulator layer comprise a dielectric material independently selected from silicon oxide, silicon nitride, silicon oxynitride, a dielectric metal oxide, a dielectric metal nitride, and a dielectric metal oxynitride.

16. The semiconductor structure of claim 8, wherein said embedded semiconductor nanoparticles laterally extend throughout said portion of said buried insulator layer underneath said portion of said semiconductor layer.

17. The semiconductor structure of claim 8, wherein said embedded semiconductor nanoparticles are embedded in said portion of said buried insulator layer that is laterally spaced from said another portion of said buried insulator layer that does not include any embedded semiconductor nanoparticles.

18. The semiconductor structure of claim 1, further comprising a gate dielectric contacting a top surface of said body region and a bottom surface of said gate electrode, and another gate dielectric contacting a top surface of said another body region and a bottom surface of said another gate electrode.

19. The semiconductor structure of claim 18, wherein said gate electrode is located above a horizontal plane including a bottom surface of said gate dielectric, and said source region, said drain region, and said semiconductor nanoparticles are located below said horizontal plane.

20. The semiconductor structure of claim 18, further comprising a gate spacer contacting sidewalls of said gate electrode and overlying a region of said semiconductor nanoparticles, and another gate spacer contacting sidewalls of said another gate electrode.

21. The semiconductor structure of claim 1, wherein a bottom surface of said gate electrode is vertically spaced from said semiconductor nanoparticles by a greater distance than bottommost surfaces of said source region and said drain region are from said semiconductor nanoparticles.

22. The semiconductor structure of claim 5, wherein said semiconductor nanoparticles are not present within any area of said shallow trench isolation structure.

23. The semiconductor structure of claim 6, wherein said shallow trench isolation structure comprises a dielectric material, extends from a top surface of said semiconductor layer through said buried insulator layer and into a top portion of said handle substrate, and laterally contacts said back gate electrode.

* * * * *